Dec. 12, 1967 JAY CEE PIGG 3,358,245

PHASE MODULATED SOLID STATE DEVICE

Filed Sept. 25, 1964 2 Sheets-Sheet 1

INVENTOR.
Jay Cee Pigg
BY
Roland A. Anderson
ATTORNEY.

Dec. 12, 1967 JAY CEE PIGG 3,358,245

PHASE MODULATED SOLID STATE DEVICE

Filed Sept. 25, 1964 2 Sheets-Sheet 2

INVENTOR.
Jay Cee Pigg
BY
Roland A. Anderson
ATTORNEY.

United States Patent Office 3,358,245

Patented Dec. 12, 1967

3,358,245

PHASE MODULATED SOLID STATE DEVICE

Jay Cee Pigg, Oak Ridge, Tenn., assignor to the United States of America as represented by the United States Atomic Energy Commission Filed Sept. 25, 1964, Ser. No. 399,413
8 Claims. (Cl. 332—31)

ABSTRACT OF THE DISCLOSURE

A semiconductor device is provided which is especially useful in high power, high frequency applications. The device consists of a semiconductor crystal, a single carrier injecting source for introducing carriers into the crystal, and means for applying a D.C. voltage across the crystal to cause the carriers to drift through the body of the crystal. Numerous electrical leads may be attached at intervals along the surface of the crystal body. A signal applied between the two leads closest to the carrier injection end of the crystal is amplified by the "bunching" effect which takes place in the crystal as the carriers drift through the body, and the amplified signal is detected between subsequent leads along the crystal.

Figures 1, 2, 3, 4, 6, 7:
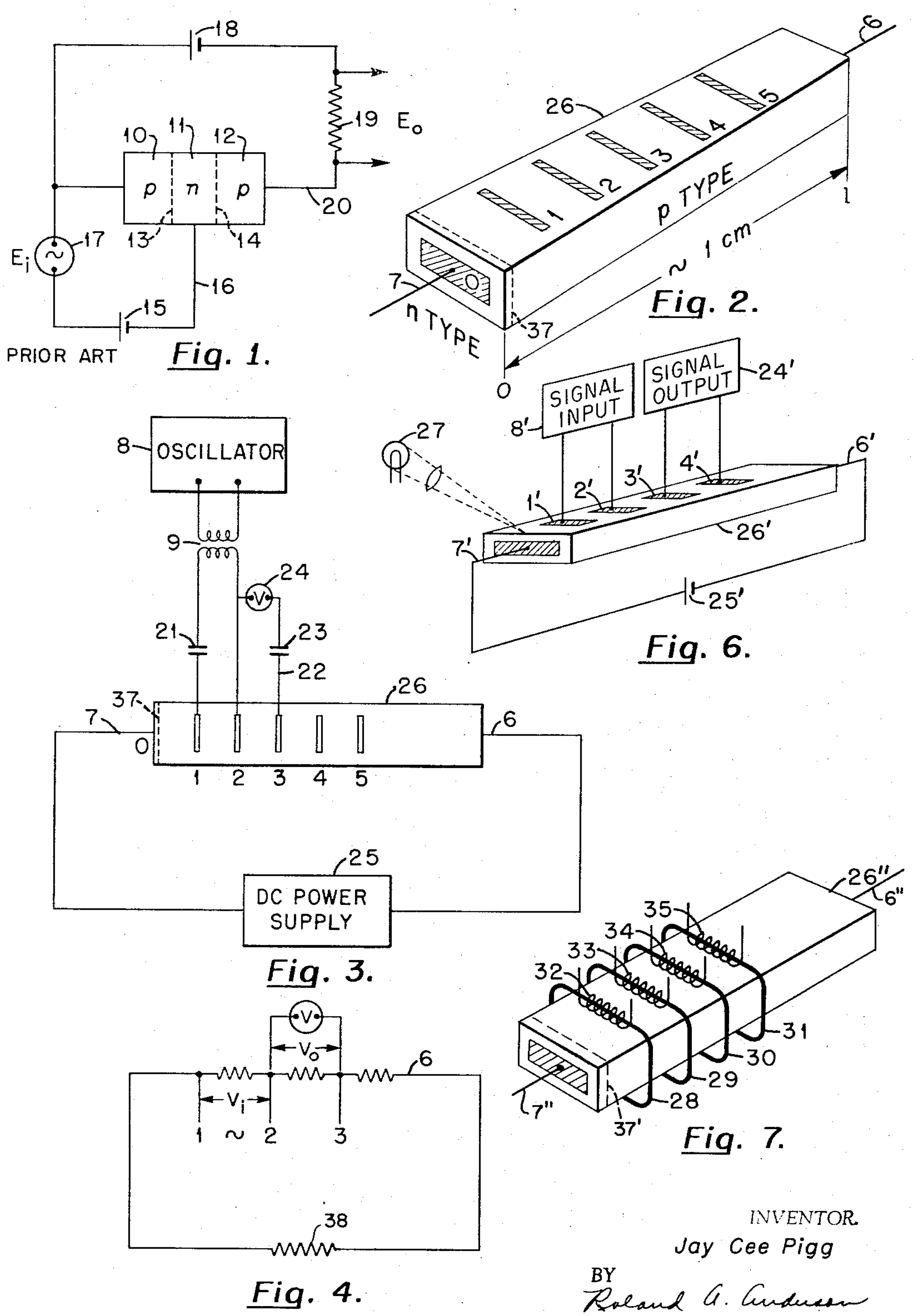

This invention relates to semiconductors, and more particularly to an active semiconductor element that is not frequency limited in the manner of previous transistor-type semiconductor devices by drift time and capacitance.

The transistor is analogous to the triode wherein two bias voltages are applied and modulation occurs by varying the amount of minority carriers injected from the emitter into the base. (Electrons and Holes in Semiconductors, by William Shockley, D. Van Nostrand Co., Inc., New York, 1950.) The transistor always requires two D.C. bias voltages for operation. The necessity of making two junctions, each of precisely controlled characteristics in every unit, adds complexity to the production.

Furthermore, there is a need in the field of solid state electronics for a high power, high frequency semiconductor device for use as an oscillator, amplifier, or mixer. The parameters involved in producing high frequency and high power in transistors are mutually exclusive. High power operation requires large junction areas which invariably result in high capacitances which short out the high frequency signals. However, reducing the junction area increases the power density through the junction, thus raising its temperature. Finally, the transit or drift time of the injected carrier through the base region and into the collecting electrode is an absolute limiting parameter in the utilization of the transistor for high frequency use.

Applicant with a knowledge of these problems of the prior art has for an object of his invention the provision of an active semiconductor device which responds to high frequency at high power.

Applicant has as another object of his invention to provide a new and improved means of generating, modulating, intermodulating, converting or amplifying electric signals.

Applicant has as another object of his invention the provision of a semiconductor device which includes a single source of injected carriers at one extremity and requires only one bias voltage across it to produce carrier drift toward the opposite end.

Applicant has as a further object of his invention the provision of a semiconductor device with a single source of injected carriers positioned ahead of and more isolated than in conventional semiconductor devices from the amplifying circuit so that large barrier capacitances are not detrimental to frequency response which, in turn, permits high power operation by making large cross sectional units possible.

Applicant has as a still further object of his invention a semiconductor device with a single carrier injecting source permitting the introduction of excess carrier concentration into the bulk of the crystal and the modulation of these excess carriers in a subsequent portion thereof by means of ohmic contacts attached to the sides of the subsequent portion and the application of controlling voltages to these contacts which will, in turn, control the drift of the injected carriers and further the detection of the controlled drift by ohmic contacts attached to the sides of the sample further along the sample, hence the transit time of the carriers through the sample is not deleterious to its frequency response.

Applicant has as a still further object of his invention the provision of a solid state electronic device which operates on the principle of phase modulation of electrical carriers and is analogous to a klystron in its operation by the bunching of the carriers and by its need for only one D.C. bias voltage.

Applicant has as a still further object of his invention the shaping of the materials in a semiconducting device in such a manner as to change and shape the electrical field gradients within the semiconducting device, which will in turn affect the drift of the carriers injected into the device.

Applicant has as a still further object of his invention the provision of a solid state electronic device in which electric signals are generated or modulated by the phase modulation of excess carriers whatever the source or means of production of the excess carrier concentration.

Other objects and advantages of my invention will appear from the following specification and accompanying drawings, and the novel features thereof will be particularly pointed out in the annexed claims.

Figure 5:
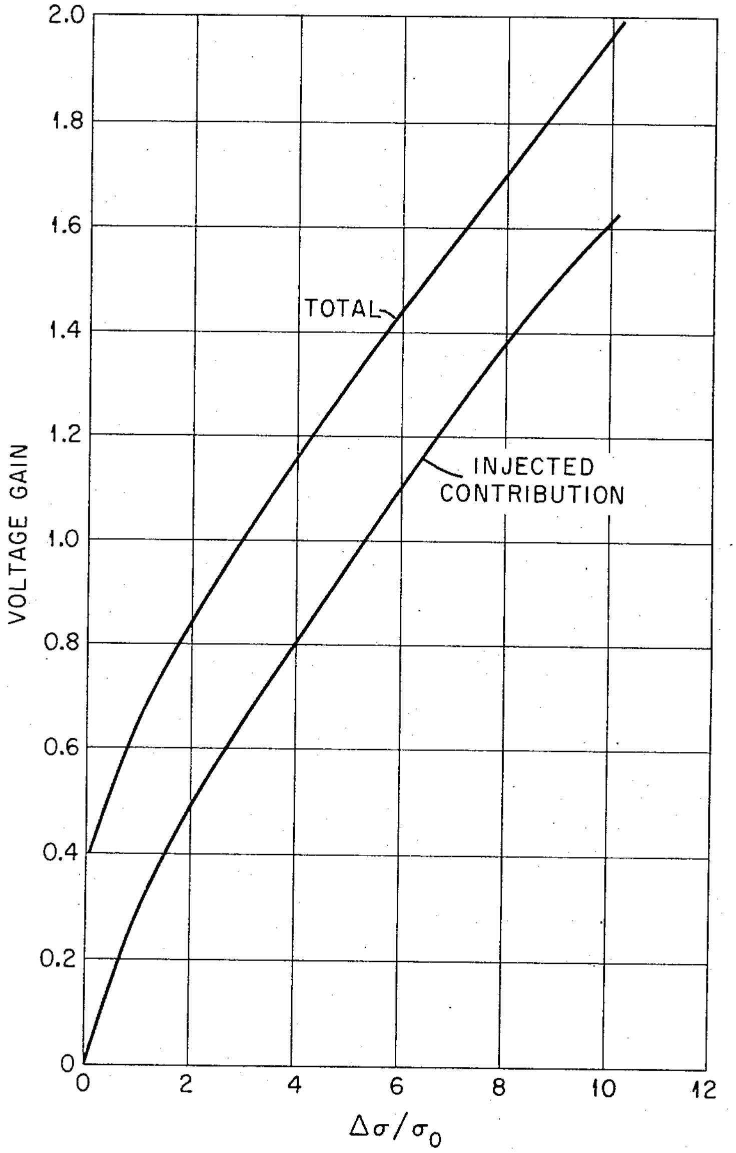

In the drawings, FIG. 1 is a schematic of a conventional transistor circuit. FIG. 2 is a perspective of my improved high power, high frequency semiconductor device. FIG. 3 is a schematic of one form of circuit for utilizing my improved active electronic device. FIG. 4 is a schematic of an equivalent circuit. FIG. 5 is a graph of gain plotted against excess carrier concentration. FIG. 6 is a schematic of a modified circuit utilizing another form of my improved electronic device wherein a light source is employed to inject carriers therein. FIG. 7 is a detail of a modified semiconductor device using inductive coupling to replace contacts.

Throughout the electronics industry, more extensive use is being made of solid state devices to replace the vacuum tubes of the prior art. This is being done to substantially reduce the size of electronic components as well as reduce fabrication and maintenance costs. Of course, there are instances where a solid state device such as the transistor, is not suitable because of the operating characteristics, e.g., in high frequency, high power applications.

The operation of the transistor is well known. (See Shockley, U.S. Patent No. 2,569,347.) Some of the characteristics which will be referred to here are summarized in FIG. 1. The conventional transistor circuit of FIG. 1 contains a semiconducting component, known as a p-n-p transistor, consisting of three regions 10, 11, and 12 with barriers 13, 14 separating the p-type portions from the n-type portion. An appropriate bias, from voltage supply 15, together with the output of a signal source 17, is applied to the base region 11 through lead 16 resulting in a varying forward bias across the emitter barrier 13. A minority carrier density is produced in the base region 11 as a consequence of the injecting properties of the forward-biased barrier 13. This injected minority carrier concentration will vary in accordance with the magnitude of the sum of the two voltages from sources 15 and 17. A second voltage, from supply 18, is imposed across the entire unit in such a manner as to bias the collector barrier 14 in the reverse direction. This reverse bias normally will permit only a small current flow through lead 20 and output load 19. The injected carriers will drift across the base region 11 under the influence of the electric field produced in base 11 by power supply 18. Junction 14 is not a barrier to these minority carriers, consequently they will contribute to the current in lead 20 and output load 19. The current through the output will then vary in a manner determined by the input signal from source 17 and bias from supply 15. The operation of such a device requires two bias sources 15, 18 and two barriers 13, 14 and results in the modulation of the amplitude of the current in the output circuit.

The barriers 13 and 14 have a certain area in every instance. It is this area and the spacing thereof which introduces the unfavorable capacitance at high frequencies. If this barrier area is made sufficiently small to reduce the unfavorable capacitance, the result is an unfavorable and undesirable high current density. Within the known limits of the transistor art, these two parameters will always be mutually exclusive and there is no known way around the problem in making high power, high frequency devices operating on the transistor principle.

It has been found, however, that a solid state or semiconductor electronic device using an active semiconductor element can be provided which is not limited by power or frequency. As used herein, "semiconductor electronic device" means a device made from semiconducting material which can by direct or intermediate means change and/or control electrical signals.

Referring now to FIG. 2, a silicon or germanium, or other semiconductor crystal 26 is shown with an injecting contact 7 affixed to one end. Although the crystal 26 may be intrinsic or an n- or p-type, the preference for p-type material in this instance was dictated by the ease of making devices with simple equipment. Both n- and p-type of all semiconductor materials will behave the same way, the only difference being that of polarity of biasing batteries and the utilization of "holes" instead of electrons as carriers. Intrinsic material would permit injection of either type of carrier.

To form the junction or injecting barrier, a layer of antimony is alloyed along one end of the block 26, and when it crystallizes, it forms an n-type material thus creating the barrier 37 between n-type and p-type materials. However, if the block is n-type material, indium may be alloyed along one end to form a p-type material which is a part if the junction. The formation of these barriers is in accordance with well known techniques. (An Introduction to Semiconductors by W. Crawford Dunlap, Jr., John Wiley and Sons, Inc., New York, 1957.)

These barriers, n-to-p or p-to-n, permit the injection of minority carriers into the crystal. If a p-type material, e.g., indium, is alloyed with a p-type crystal, or an n-type, e.g., antimony, is alloyed with an n-type crystal, a rectifying concentration boundary or barrier will be formed which permits the injection of majority carriers. The use of majority carriers may be of importance in those instances where the shorter lifetime of minority carriers would be exceedingly detrimental. In either instance, excess carrier injection is effected. The term "excess carrier concentration" as used herein, therefore, is the number of mobile charges per unit volume greater than the number which would exist at the sample temperature under static equilibrium conditions whether they be of minority or majority type.

The contacts 1, 2, 3, etc., and the current lead contact 6 on p-type material are preferably formed with indium. The preparation of the crystal and the attachment of the contacts 1, 2, 3, 4 and 5 at spaced intervals along the crystal should be undertaken under a vacuum. This permits using a higher resistivity crystal and the production of a cleaner device with smaller and better contacts.

However, in lieu of spaced electrical contacts, concentric spaced inductive rings 28, 29, 30, 31 of soft iron or other suitable magnetic material may be positioned along the block 26'' with secondary windings 32, 33, 34 and 35, to inductively pick off the potentials, as shown in FIG. 7.

Referring now to FIG. 3, a semiconducting crystal is shown connected in a circuit. The block 26 is the device made preferably of high resistivity material. As shown, it is thin, of the order of 1 to 2 mm. thick and about 5 to 7 mm. long and 3 to 5 mm. wide. The contacts 1, 2, 3, 4 and 5 are spaced of the order of 2 mm. apart. The thinness of the device aids in heat dissipation. Furthermore, the crystal may be physically tapered in any or all dimensions, as shown in FIG. 2, to vary within it the field gradients that are introduced by the D.C. power supply.

The electric field gradient may also be modified by producing an impurity gradient along the crystal. The injecting source—in this case a rectifying contact 7—has a D.C. biasing potential from source 25 impressed across it by a voltage from the rectifying contact 7 to the ohmic contact 6 in the forward direction which will cause an excess of carriers, the type of which will be governed by the materials as set forth above, to be injected into the crystal from the barrier and which will drift down the crystal. An A.C. voltage applied to one set of contacts, such as contacts 1 and 2, will produce an A.C. voltage across another pair of subsequent contacts, such as contacts 2 and 3, or 3 and 4 due to the bunching of carriers as they drift in that direction through the crystal. An A.C. voltage across contacts 3 and 4 will result in a negligible A.C. voltage across a preceding set, such as contacts 1 and 2, because of the direction of drift of the carriers. Such behaviour would be expected by analogy with klystron operation. Thus, to the first contacts, 1 and 2, nearest to the contact 7 is coupled an oscillator 8 through a coupling circuit including transformer 9 and capacitor 21. Then beyond the oscillator, an output circuit 22 is coupled to contacts 2 and 3 with a blocking condenser 23 to eliminate D.C. voltage from the output, in this case the meter 24. Depending upon the adjustment of the parameters involved in the construction of the device this output voltage will be much larger than the input voltage. By placing the injecting source outside the amplifying region, any capacitance of the barrier is isolated from the amplifying circuit. This is in contrast to the transistor of FIG. 1 where the barriers 13 and 14 limit the upper frequency.

The semiconductor electronic device using the crystal 26 is similar in operation to that of a klystron in that the current is phase modulated rather than amplitude modulated, and in that circuit of FIG. 3, will amplify a signal. The gain of the device can be defined as the ratio of the output voltage to the input voltage. When a shorting jumper is connected between contacts 7 and 1 of FIG. 3, the equivalent circuit will be as shown in FIG. 4. When there is no D.C. current through the block 26, the zero current gain is given from the resistance voltage divider equivalent circuit of FIG. 4, as follows:

$$\text{gain} = \frac{V_o}{V_i} = \frac{R_{2-3}}{R_{2-3}+R_{3-6}+R_{6-1}}$$

In the above equation the subscripts indicate the resistance between certain points of the circuit of FIG. 4. Resistor 38 is the equivalent power supply resistance. The output signal increases when a D.C. current is passed through the crystal to produce injection from the barrier 37 of FIG. 3.

The presence of the injected carriers will produce an increase in the conductivity in the crystal 26. The concentration of carriers thus produced is given to a first approximation by the ratio of the change in conductivity to the initial conductivity. Furthermore, the gain of the device is observed to increase as the injected carrier concentration increases. This dependence of gain on injected carrier concentration is shown in FIG. 5 for both the total gain and the gain corrected to remove the above-described voltage divider contribution.

A signal across contacts 1 and 2 will produce an output signal across any pair of subsequent contacts such as 2 and 3, or 3 and 4, which exhibits a dependence of gain on injected carrier concentration of the type shown in FIG. 5. The change in signal voltage across a resistor in series with the crystal is only that which can be attributed to the change of resistances in the equivalent voltage divider. A signal applied across any set of contacts such as 2 and 3 will produce a resultant signal across any other set of contacts down stream from the input such as 3 and 4, which will show the same dependence upon injected carrier density, as in the previous case. In this second case, however, the observed signal across contacts 1 and 2 will decrease as the injected carrier concentration increases as one would expect from the resultant change in the equivalent voltage divider.

No reactive contribution to the impedance between the contacts of the crystal has been observed for the frequency range from 20 c.p.s. to 200 kc. There is, however, a frequency dependent phase shift between the input and output signals. These observations establish that the observed effect is the result of the phase modulation of the injected carrier concentration and not an amplitude modulation of the circuit current.

FIG. 6 is a modification of the system of FIG. 3 wherein the barrier 37 of FIG. 3 has been omitted and excess carriers are injected into the forward end of the block 26' by applying a beam of light from a source 27'. This may be referred to as photon excitation. With the barrier removed, the forwarding biasing potential necessary to drift the carriers along the body is decreased and the resistance heating that would occur in the barrier is eliminated. Furthermore, the crystal 26' is more easily fabricated.

Having thus described my invention, I claim:

1. A semiconductor electronic device comprising a semiconductor crystal, a source for continually injecting excess carrier concentration into the crystal adjacent one extremity, means for applying an electric field gradient across the crystal for drifting the carriers longitudinally thereof, means for inducing an alternating electric field in the crystal adjacent the excess carrier injecting extremity thereof to produce a longitudinal variation in said electric field gradient, thereby, phase modulating the drifting carriers in the crystal, and means for deriving an output signal from the crystal responsive to the modulated drifting carriers.

2. A semiconductor device comprising an elongated block of semiconductor material, a barrier at one end for continually injecting excess carrier, a circuit connected across the barrier and the opposite extremity of the body for applying a forward D.C. biasing potential, a series of ohmic contacts spaced longitudinally along the block, a circuit connected to a pair of said contacts adjacent the barrier for application of a signal to produce phase modulation of the carriers within the semiconductor, and a circuit connected to a pair of said contacts beyond the signal circuit to remove the modulated output.

3. A semiconductor amplifier system comprising a crystal of high resistivity semiconductor material, a barrier at one end of the crystal for continually injecting excess carriers, a biasing potential source connected between the barrier end and the opposite end of the crystal to provide a forward D.C. biasing potential, a series of ohmic contacts spaced longitudinally along the crystal, a source of oscillations connected to a pair of said contacts nearest the barrier for modulating drifting carriers, and an output circuit connected to a pair of said contacts beyond the oscillator to remove the amplified signals.

4. A semiconductor amplifier system comprising an elongated tapered crystal of semiconductor material, an injection barrier joined to one end of the tapered crystal, a series of ohmic contacts spaced longitudinally along the crystal, a bias potential connected across the barrier and the opposite end of the crystal for applying a forward bias to the semiconductor material, a signal generator connected to a pair of said contacts nearest the injection barrier for phase modulating the drifting carriers, and an output circuit connected to a pair of said contacts beyond the signal generator to remove the amplified output signal.

5. A semiconductor amplifier system comprising an elongated semiconductor of p-type high resistivity material, a barrier of n-type material at one end of the semiconductor, a source of biasing potential connected to the extremities of the semiconductor for applying a forward bias to continually inject excess carriers, a series of ohmic contacts joined to and longitudinally spaced along the semiconductor, a signal source connected to a pair of said contacts nearest the barrier for phase modulating the carriers, and an output circuit connected to a pair of said contacts beyond the signal generator to extract the modulated output signal.

6. A semiconductor electronic device comprising an elongated block of semiconductor material, a source at one end for continually injecting excess minority carriers into said block, a circuit connected across the source and the opposite extremity of the block for applying a forward DC biasing potential, to drift the carriers through said block, a series of ohmic contacts spaced longitudinally along the block on one side of two opposite sides, a signal source connected to a pair of said contacts nearest to the said one end for application of a signal to produce phase modulation of the carriers within the crystal, and an output circuit connected to a pair of said contacts beyond the signal circuit to remove the modulated output.

7. A semiconductor device as set forth in claim 6 wherein the source for injecting minority carriers is a light source.

8. A semiconductor electronic device comprising an elongated crystal of semiconductor material, a barrier joined to one extremity thereof for injecting excess carriers, contacts at either extremity of the crystal for applying a forward bias to drift the carriers longitudinally of the crystal, and a series of rings of magnetic material positioned concentrically of the crystal in spaced relation and inductively coupled to the crystals, and coils carried by the rings for introducing into and removing signals from the crystal.

References Cited

UNITED STATES PATENTS

| | | | |
|---|---|---|---|
| 2,655,607 | 10/1953 | Reeves | 307—88.5 |
| 2,736,822 | 2/1956 | Dunlap | 307—88.5 |
| 2,832,898 | 4/1958 | Camp | 307—88.5 |
| 3,246,164 | 4/1966 | Richmond | 333—30 X |

ALFRED L. BRODY, *Primary Examiner.*